United States Patent
Sansoni et al.

(10) Patent No.: US 8,390,980 B2
(45) Date of Patent: Mar. 5, 2013

(54) ELECTROSTATIC CHUCK ASSEMBLY

(75) Inventors: Steven V. Sansoni, Livermore, CA (US); Cheng-Hsiung Tsai, Cupertino, CA (US); Shambhu N. Roy, San Jose, CA (US); Karl M. Brown, Mountain View, CA (US); Vijay D. Parkhe, San Jose, CA (US); Hari Ponnekanti, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 796 days.

(21) Appl. No.: 12/539,410

(22) Filed: Aug. 11, 2009

(65) Prior Publication Data

US 2010/0039747 A1 Feb. 18, 2010

Related U.S. Application Data

(60) Provisional application No. 61/088,289, filed on Aug. 12, 2008.

(51) Int. Cl.
H02N 13/00 (2006.01)
(52) U.S. Cl. ......................................... 361/234
(58) Field of Classification Search .................. 361/234
See application file for complete search history.

(56) References Cited

U.S. PATENT DOCUMENTS

| | | | |
|---|---|---|---|
| 5,880,924 A | 3/1999 | Kumar et al. | |
| 5,903,428 A | 5/1999 | Grimard et al. | |
| 5,923,521 A | 7/1999 | Burkhart | |
| 6,067,222 A | 5/2000 | Hausmann | |
| 6,081,414 A * | 6/2000 | Flanigan et al. | 361/234 |
| 6,483,690 B1 | 11/2002 | Nakajima et al. | |
| 6,538,872 B1 | 3/2003 | Wang et al. | |
| 7,672,111 B2 * | 3/2010 | Miyaji et al. | 361/234 |
| 2002/0135969 A1 * | 9/2002 | Weldon et al. | 361/234 |
| 2005/0105243 A1 | 5/2005 | Lee et al. | |
| 2005/0215073 A1 | 9/2005 | Nakamura et al. | |
| 2006/0012087 A1 * | 1/2006 | Matsuda et al. | 264/619 |
| 2006/0043065 A1 * | 3/2006 | Buchberger et al. | 216/63 |
| 2007/0158824 A1 | 7/2007 | Hsu | |
| 2007/0224451 A1 * | 9/2007 | Chandran et al. | 428/698 |
| 2008/0098833 A1 * | 5/2008 | Sasaki et al. | 73/865.9 |

FOREIGN PATENT DOCUMENTS

| | | |
|---|---|---|
| EP | 1191581 | 3/2002 |
| JP | 2001223261 A | 8/2001 |
| JP | 2002246455 A | 8/2002 |
| JP | 2007250860 | 9/2007 |
| KR | 1019990076702 | 10/1999 |
| KR | 1020010111058 | 12/2001 |
| KR | 10200505035 A | 1/2005 |
| KR | 10-2005-0047148 | 7/2005 |

OTHER PUBLICATIONS

Vaidya, "Thermal Expansion of Metal-Matrix Composites".
Supplementary European Search Report dated Feb. 9, 2012 for European Patent Application 09807085.7 (PCT/US/2009052917).
PCT Search Report for PCT/US2009/052917 dated Mar. 19, 2010 (APPM/012050/PCT).

* cited by examiner

*Primary Examiner* — Ronald W Leja
(74) *Attorney, Agent, or Firm* — Patterson & Sheridan, LLP

(57) ABSTRACT

Embodiments of the present invention provide a cost effective electrostatic chuck assembly capable of operating over a wide temperature range in an ultra-high vacuum environment while minimizing thermo-mechanical stresses within the electrostatic chuck assembly. In one embodiment, the electrostatic chuck assembly includes a dielectric body having chucking electrodes which comprise a metal matrix composite material with a coefficient of thermal expansion (CTE) that is matched to the CTE of the dielectric body.

8 Claims, 13 Drawing Sheets

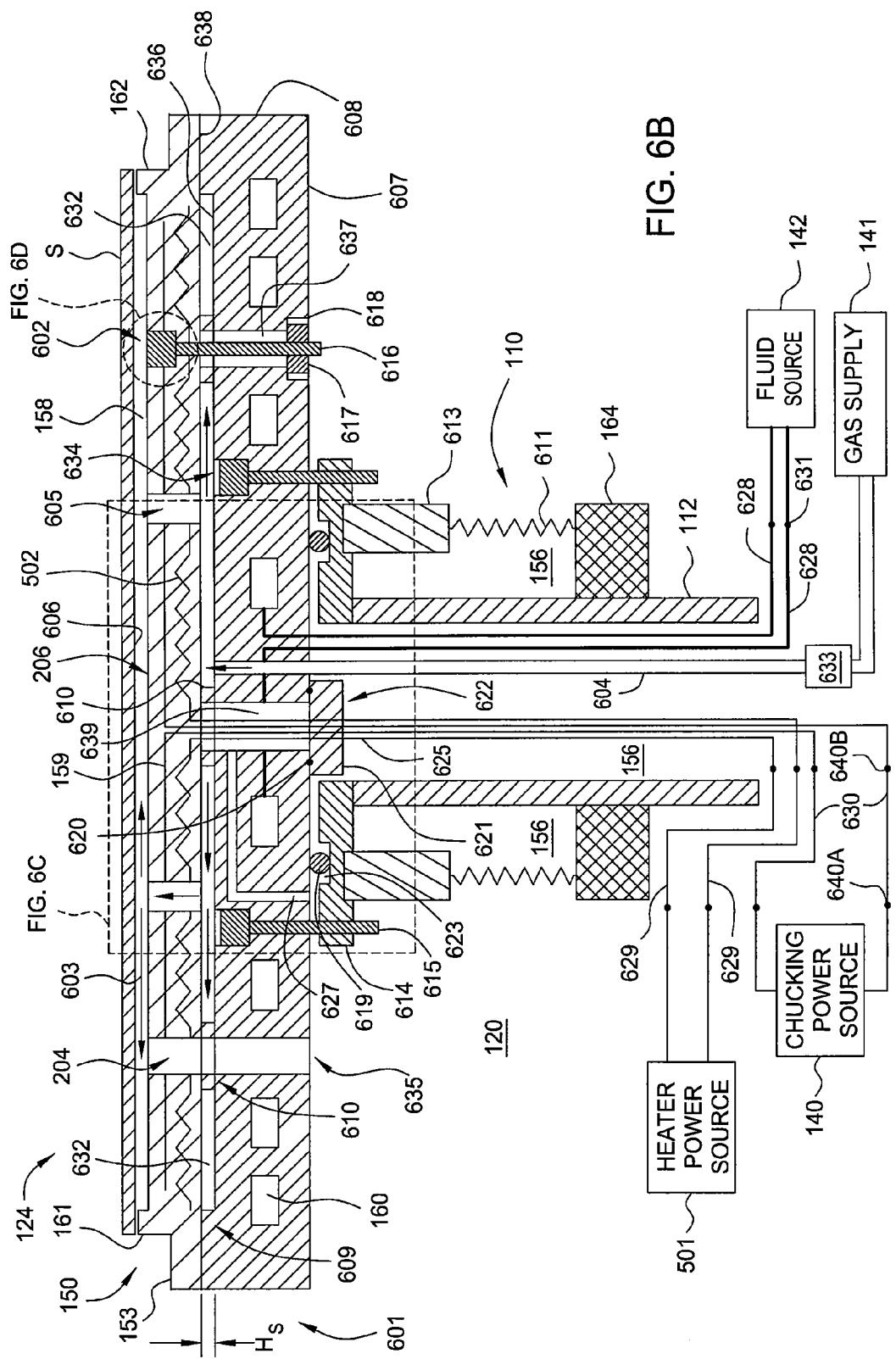

ELECTROSTATIC CHUCK ASSEMBLY

CROSS-REFERENCE TO RELATED APPLICATIONS

This application claims benefit of provisional U.S. Patent Application Ser. No. 61/088,289, filed Aug. 12, 2008, entitled "Electrostatic Chuck Assembly," and is hereby incorporated by reference in its entirety.

BACKGROUND OF THE INVENTION

1. Field of the Invention

Embodiments of the present invention generally relate to substrate supports used in processing chambers for fabricating microelectronic devices and, more specifically, to electrostatic chucks used in plasma processing chambers.

2. Description of the Related Art

Electrostatic chucks are widely used to hold substrates, such as semiconductor wafers, during substrate processing in processing chambers used for various applications, such as physical vapor deposition, etching, or chemical vapor deposition. Electrostatic chucks typically include one or more electrodes embedded within a unitary chuck body which comprises a dielectric or semi-conductive ceramic material across which an electrostatic clamping field can be generated. Semi-conductive ceramic materials, such as aluminum nitride, boron nitride, or aluminum oxide doped with a metal oxide, for example, may be used to enable Johnsen-Rahbek or non-Coulombic electrostatic clamping fields to be generated.

In a monopolar electrode chuck, the chuck comprises a single electrode which is electrically biased with respect to the substrate by an applied voltage. A plasma is introduced into the processing chamber to induce opposing electrostatic charge in the chuck and substrate to create an attractive electrostatic force that electrostatically holds the substrate to the chuck. In a bipolar electrode chuck, the chuck comprises two electrodes which are electrically biased relative to one another to provide an electrostatic force that holds the substrate to the chuck. Unlike the monopolar electrode chuck, the bipolar chuck does not require the presence of a plasma to generate an electrostatic clamping force.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to the chucking surface to allow a greater degree of control over substrate temperature. This control may be further enhanced by using a heat transfer gas for thermal coupling between the chuck and substrate.

Various processes used in the fabrication of integrated circuits may require high temperatures and wide temperature ranges for substrate processing. Such temperatures may range from about 20° C. to about 150° C., and possibly as high as 300° C. to 500° C. or higher for some processes. It is therefore often desirable to have an electrostatic chuck which can operate over a wide range of temperatures.

To utilize the advantages of an electrostatic chuck, the electrostatic chuck typically forms part of a substrate support assembly which also includes various components for heating and cooling the substrate and for routing power to the chuck electrodes. In addition, the substrate support assembly may also include components for providing a substrate bias and for providing plasma power. As a result, the ceramic body of the electrostatic chuck may include additional electrodes and other components, such as heating elements, gas channels, and coolant channels, to name a few. Also, the electrostatic chuck may be attached to supporting components which are made of metal.

However, it is difficult to attach metal components to or embed metal components (e.g., electrodes) within the ceramic chuck body because of differences in the thermal expansion coefficients (CTE) of the ceramic and metal which can result in thermo-mechanical stresses that can cause the ceramic to fracture or chip during thermal cycling. Additionally, differences in the CTEs may increase with temperature resulting in greater thermo-mechanical stresses at higher temperatures. To compensate for these stresses, the ceramic chuck body may be made thicker to provide greater strength and prevent fracture, but this often adds cost to the chuck body.

Additionally, gas conduits and electrical lines are often coupled to the electrostatic chuck through interfaces or feedthroughs which provide vacuum seals. The feedthroughs may be sealed by polymer o-rings. However, the polymer o-rings often lose compliance and resilience at high temperatures which can lead to failure of the vacuum seal. Also, any fracture of the ceramic chuck due to thermo-mechanical stresses caused by differences in the CTEs can result in seal failures and vacuum leaks.

In certain applications, it may be desirable to apply a bias to the substrate and/or generate a plasma by coupling radio frequency (RF) power at the electrodes of the electrostatic chuck. The efficiency of the RF power transmission is dependent in part on various properties of the chuck body, such as the thickness and dielectric constant of the dielectric layer between the electrodes and substrate. For applications where RF power may be applied over a wide range of frequencies, such as between about 50 kHz and about 60 MHz, for example, it may be desirable to have an electrostatic chuck which can be optimized in a cost effective way for efficient RF power transmission over a wide frequency range.

Therefore, a need exists for a cost effective electrostatic chuck that can operate at high temperatures and over a wide range of temperatures in a high vacuum environment without failure. Additionally, a need exists for a cost effective electrostatic chuck which can efficiently couple RF power over a wide frequency range.

SUMMARY OF THE INVENTION

Embodiments of the present invention provide a cost effective electrostatic chuck which can: operate over wide temperature ranges in a high vacuum environment, and efficiently couple RF power over a wide frequency range, for substrate biasing and/or plasma formation.

In one embodiment, an electrostatic chuck assembly comprises a support base and a puck, the puck comprising a frontside surface, an electrically insulative puck base, one or more chucking electrodes disposed on the frontside surface, wherein the one or more chucking electrodes comprise an electrically conductive metal matrix composite material, and a dielectric layer disposed on the frontside surface and covering the one or more chucking electrodes.

In another embodiment, an electrostatic chuck assembly comprises a support housing, a puck having an electrically insulative upper puck plate with one or more chucking electrodes and one or more heating elements, a lower puck plate bonded to the upper puck plate within a bonding region comprising a raised portion, and a gap separating the upper puck plate from the lower puck plate outside the bonding region, one or more o-rings disposed between the lower puck plate and support housing, and a cooling plate comprising one or more cooling channels and disposed between the bonding region and the one or more o-rings, wherein the plate is coupled to and in thermal communication with the lower puck plate.

In yet another embodiment, an electrostatic chuck assembly comprises a bellows assembly, a puck having a frontside surface, one or more chucking electrodes, and a plurality of puck bolt holes, a cooling plate comprising one or more central openings, each opening having a central opening volume, one or more outer steps and inner steps, each having a support surface which supports the puck, and one or more vent holes formed in the cooling plate, each one or more vent holes formed in the cooling plate, each vent hole comprising a channel which provides fluid communication between a first hole formed in a sidewall of the central opening volume and a second hole disposed on a surface of the cooling plate, and a gap disposed between the puck and cooling plate, wherein the puck is detachable from the cooling plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6B is a schematic cross-sectional view of the electrostatic chuck assembly shown in FIG. 6A according to an embodiment of the invention.

To facilitate understanding, identical reference numerals have been used, where possible, to designate identical elements that are common to the figures. It is contemplated that features of one embodiment may be incorporated in other embodiments without further recitation.

DETAILED DESCRIPTION

The present invention generally provides a robust, cost effective electrostatic chuck capable of operating over wide temperature ranges in ultra-high vacuum environments. Embodiments of the invention include an electrostatic chuck assembly which provides efficient radio frequency coupling for substrate biasing and/or plasma formation.

Figure 1:
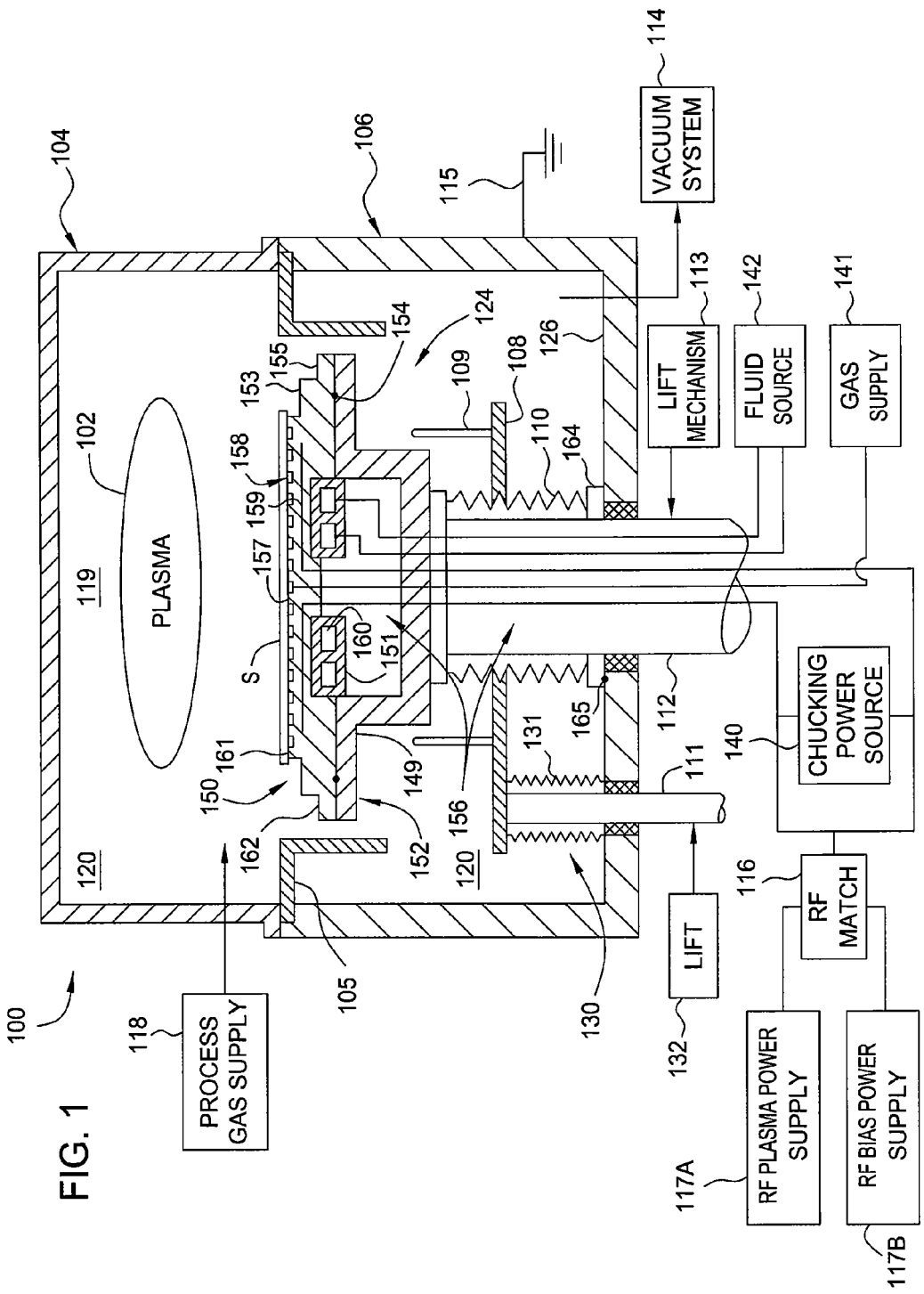
FIG. 1 is a schematic cross-sectional view of a plasma processing chamber according to one embodiment of the invention.

FIG. 1 is a schematic cross-sectional view of plasma processing chamber according to one embodiment of the invention. In one embodiment, the plasma processing chamber is a sputter etch processing chamber. However, other types of processing chambers, such as physical vapor deposition (i.e., sputtering) chambers, for example, may also be used to practice the invention.

A chamber 100 is a vacuum chamber which is suitably adapted to maintain sub-atmospheric pressures within a chamber interior volume 120 during substrate processing. The chamber 100 includes a chamber body 106 covered by a dome 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and dome 104 may be made of metal, such as aluminum.

Within the chamber interior volume 120 is disposed an electrostatic chuck assembly 124 for supporting and chucking a substrate "S", such as a semiconductor wafer, for example. The electrostatic chuck assembly 124 comprises a puck 150 upon which the substrate "S" rests, a cooling plate 151, and a support base 152. The support base 152 includes a support housing 149, bellows assembly 110 and a hollow support shaft 112. The support shaft 112 is coupled to a lift mechanism 113 which provides vertical movement of the electrostatic chuck assembly 124 between an upper, processing position (as shown in FIG. 1) and a lower, transfer position (not shown). The bellows assembly 110 is disposed about the support shaft 112 and is coupled between the support base 152 and a bottom surface 126 of chamber 100 to provide a flexible seal that allows vertical motion of the electrostatic chuck assembly 124 while preventing loss of vacuum from within the chamber 100. The bellows assembly 110 also includes a lower bellows flange 164 in contact with an o-ring 165 which contacts bottom surface 126 to help prevent loss of chamber vacuum.

The puck 150 includes an electrically insulative puck base 162 with two chucking electrodes 159 embedded therein and which are electrically connected to a chucking power source 140, such as a DC power supply. In another example, the puck 150 may include one chucking electrode 159 or more than two chucking electrodes 159 for substrate chucking. For the case of two electrodes, the chucking electrodes 159 may each be thin semicircular or "D" shaped plates, with each chucking electrode 159 attached to one terminal of a DC power supply. For a single electrode, the chucking electrode 159 may be a thin disk attached to one terminal of a DC power supply (the other DC terminal being attached to ground potential). However, the one or more chucking electrodes 159 may have any suitable shape, which may include rings, wedges, strips, and so on. The chucking electrodes 159 may be made of any suitable electrically conductive material, such as a metal or metal alloy, for example.

The two chucking electrodes 159 are coupled to a radio frequency (RF) plasma power supply 117A and an RF bias power supply 117B through one or more RF matches 116. The RF plasma power supply 117A provides power to form a plasma 102, and the RF bias power supply 117B applies an RF bias to the substrate "S." In another embodiment, the RF power supplies are not coupled to the electrostatic chuck assembly 124.

The puck 150 includes a first flange 153 and a second flange 155. The first flange 153 may be used to support an edge ring (not shown) to reduce edge effects during substrate etching, and the second flange 155 may be used to couple the puck 150 to the support base 152. In another embodiment, the puck 150 includes only a first flange 153 and no second flange 155.

The puck 150 also includes a plurality of protrusions or mesas 157 which support substrate "S", and between the mesas 157 are gas grooves 158 which are in fluid communication with a gas supply 141. The gas supply 141 provides a heat transfer gas which flows between the backside of substrate "S" and the puck 150 in order to help regulate the rate of heat transfer between the puck 150 and substrate "S." In one example, the heat transfer gas may comprise an inert gas, such as argon. The heat transfer gas may be delivered to the gas grooves 158 through one or more holes (not shown) in the puck 150 which are in fluid communication with one or more gas grooves 158. The puck 150 may also have an outer peripheral ring 161 which contacts the substrate "S" near its edge and which may help control the amount of heat transfer gas which escapes from behind the substrate "S."

Temperature regulation of the substrate "S" is further facilitated by multiple cooling channels 160 which are disposed in cooling plate 151, and the cooling channels 160 are coupled to and in fluid communication with a fluid source 142 which provides a coolant fluid, such as water, although any suitable coolant fluid, gas or liquid, may be used. In another embodiment, the puck 150 may also include heating elements (see 502 in FIG. 5A) disposed between the chucking electrodes 159 and cooling plate 151. Additionally, the temperature of the puck 150, cooling plate 151, and/or other components of the electrostatic chuck assembly 124 may be monitored using one or more temperature sensors (not shown), such as thermocouples and the like, coupled to one or more temperature monitors. In one example, the puck 150 is coupled to at least one thermocouple for temperature monitoring.

The electrostatic chuck assembly 124 includes the cooling plate 151 which is coupled to the puck 150 using bolts (not shown) or other suitable fastening devices. The cooling plate 151 may be partially recessed within the puck 150 to provide better thermal coupling with the puck 150 and substrate "S." A thermally conductive material may also be provided between the puck 150 and cooling plate 151 to further improve thermal coupling between the puck 150 and cooling plate 151. In another embodiment, a bonding agent is used to bond the cooling plate 151 to the puck 150.

The puck 150 is coupled to the support housing 149 of support base 152 using multiple bolts (not shown) disposed around the second flange 155 of puck 150. One or more o-rings 154 are located within o-ring grooves (see FIG. 5A) between the puck 150 and support housing 149 to provide a vacuum seal between the chamber interior volume 120 and interior volumes 156 within the electrostatic chuck assembly 124. The interior volumes 156 include open spaces within the support housing 149 and within the hollow support shaft 112 for routing conduits and wiring, and the interior volumes 156 are in fluid communication with atmospheric pressure external to chamber 100. In the present embodiment, the puck 150 is detachable from the support housing 149 so that the puck 150 may be replaced without replacing the support housing 149 and support base 152. In another embodiment, the puck 150 and support housing 149 are bonded together to form an integral unit.

The support shaft 112 and bellows assembly 110 are coupled to the support housing 149 to form support base 152. In one embodiment, the support shaft 112 and bellows assembly 110 are welded to the support housing 149. In another embodiment, the support shaft 112 and bellows assembly 110 may form a separate assembly which is bolted to the support housing 149. In yet another embodiment, the electrostatic chuck assembly 124 may be suitably adapted so that support shaft 112 and bellows assembly 110 are coupled directly to cooling plate 151 and no support housing 149 is used.

A substrate lift 130 includes lift pins 109 mounted on a platform 108 connected to a shaft 111 which is coupled to a second lift mechanism 132 for raising and lowering the substrate lift 130 so that the substrate "S" may be placed on or removed from the puck 150. The electrostatic chuck assembly 124 includes thru-holes (see 204 in FIG. 2) to receive the lift pins 109. A bellows assembly 131 is coupled between the substrate lift 130 and bottom surface 126 to provide a flexible seal which maintains chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases, such as argon, to the chamber 100 for etch processing.

To create a plasma 102 for sputter etching the substrate "S", the chucking electrodes 159 are coupled to the RF plasma power supply 117A and the RF bias power supplies 117B through the one or more RF matches 116 to form plasma 102 and apply a bias to the substrate "S" within the chamber 100. The chucking electrodes 159 function as an RF cathode which is electrically isolated from the chamber body 106 and dome 104, and both the chamber body 106 and dome 104 are connected to a ground 115. Process gas, such as argon, is introduced into the chamber 100 from process gas supply 118 and the gas pressure is adjusted to a preset value for plasma ignition. A plasma 102 is ignited in the processing volume 119 through capacitive coupling when RF power is delivered to the chucking electrodes 159 from the RF plasma power supply 117A. The RF match 116 may be adjusted or preset to improve the efficiency of power transfer from the RF plasma power supply 117A to the plasma 102. The RF bias power supply 117B applies a bias to the chucking electrodes 159 so that positively charged ions in the plasma 102 are accelerated to the surface of the substrate "S" and the substrate surface is sputter etched.

The RF plasma power supply 117A and RF bias power supply 117B may provide power at a frequency within a range of about 0.5 MHz to about 60 MHz, or more preferably near about 2 MHz and about 13.56 MHz. A lower frequency may be used to drive the bias and thereby the ion energy and a higher frequency may be used to drive the plasma 102.

Figure 2:
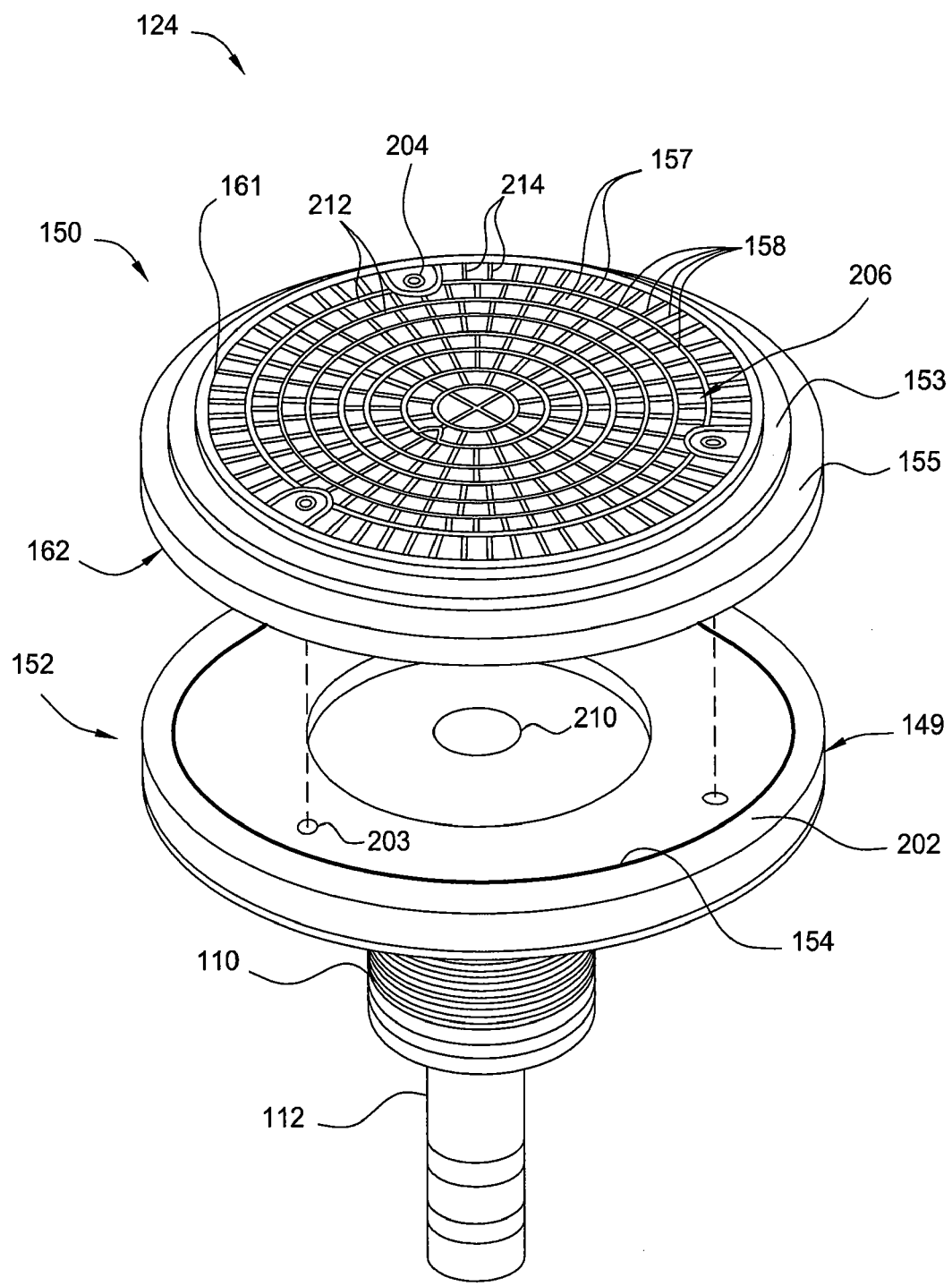
FIG. 2 depicts an exploded view of one embodiment of the electrostatic chuck assembly shown in FIG. 1.

FIG. 2 depicts an exploded view of one embodiment of the electrostatic chuck assembly 124 shown in FIG. 1. For clarity, electrical wiring and fluid-carrying conduits which are routed through a shaft thru-hole 210 in support shaft 112 are not shown. The support housing 149 includes a flange 202 with flange thru-holes 203 which are in alignment with lift pin holes 204 so that lift pins 109 may raise or lower a substrate from a frontside surface 206 of puck 150. An o-ring 154 is disposed within an o-ring groove (not shown) on flange 202 so that when puck 150 is coupled to the support housing 149 a vacuum seal may be formed.

The frontside surface 206 may be bounded by the outer peripheral ring 161 and may include a plurality of raised wedge-shaped mesas 157 defined by intersecting gas grooves 158 which distribute a heat transfer gas as described above. The gas grooves 158 include radial channels 214 which intersect with circular channels 212. The gas grooves 158 may comprise a plurality of channels which intersect at right angles to form a grid-like pattern. Alternately, radial patterns may be combined with grid and circular patterns, but other geometries may also be used for the pattern of gas grooves 158.

The one or more mesas 157 which are disposed between intersecting gas grooves 158 may comprise square or rectangular blocks, cones, wedges, pyramids, posts, cylindrical mounds, or other protrusions of varying sizes, or combinations thereof that extend up from the puck 150 and support a substrate. In one embodiment, the height of the mesas 157 may range from about 50 microns (micrometers) to about 700 microns, and the width (or diameter) of the mesas 157 may range from about 500 microns to about 5000 microns. In another example, the puck 150 may include a frontside surface 206 having a plurality of gas grooves 158 (e.g., radial channels 214) formed therein and which does not include mesas 157.

The puck base 162 may comprise at least one of aluminum oxide, aluminum nitride, silicon oxide, silicon carbide, silicon nitride, titanium oxide, zirconium oxide, although other material may also be used. The puck base 162 may be a unitary monolith of ceramic made by hot pressing and sintering a ceramic powder, and then machining the sintered form to form the final shape of the puck 150.

Figures 3A, 3B:
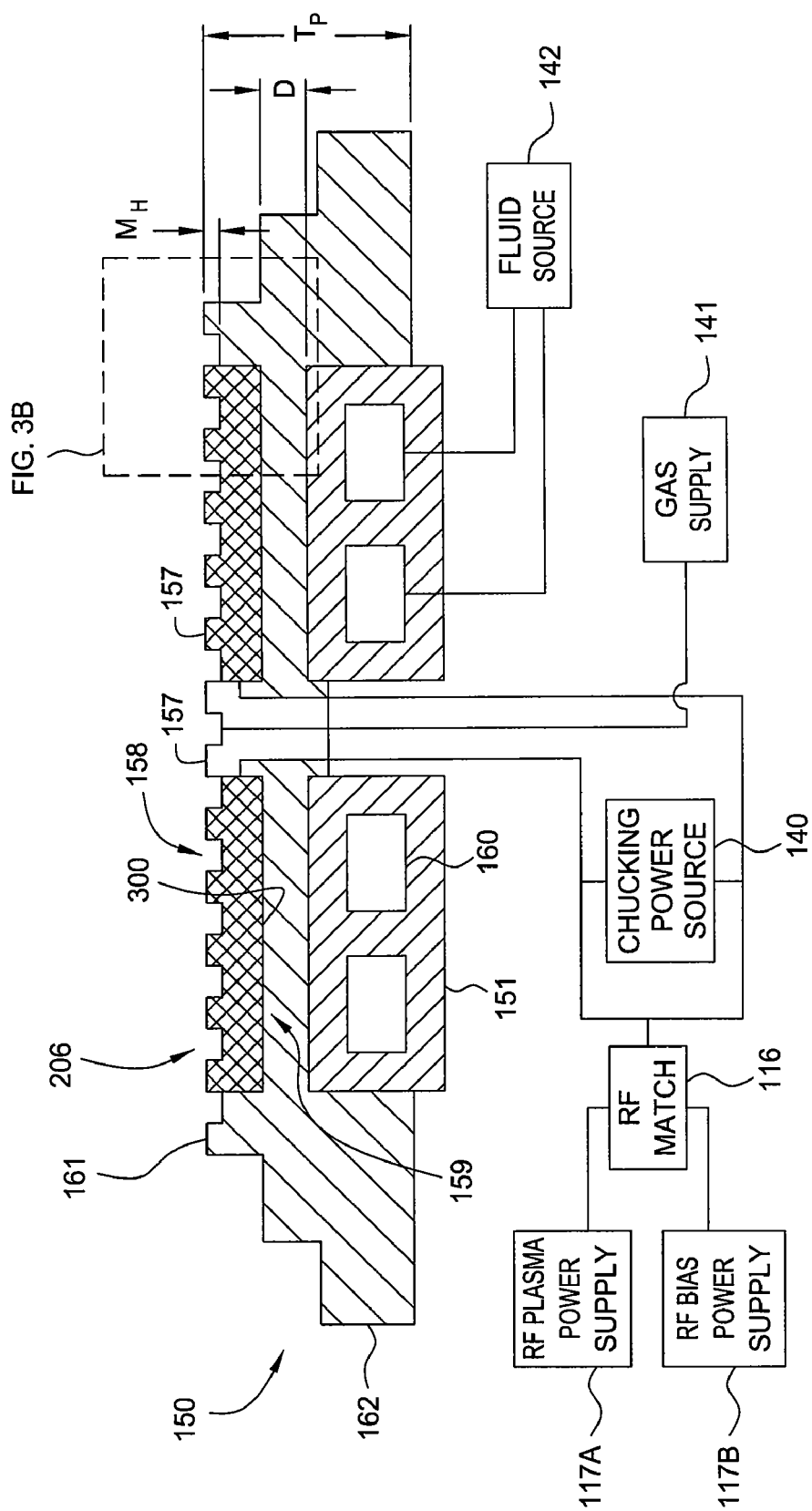
FIG. 3A is a schematic cross-sectional view of the electrostatic chuck assembly shown in FIG. 1 according to one embodiment of the invention.
FIG. 3B is a schematic cross-sectional detail view of the electrostatic chuck assembly shown in FIG. 3A according to one embodiment of the invention.
Figure 3B:
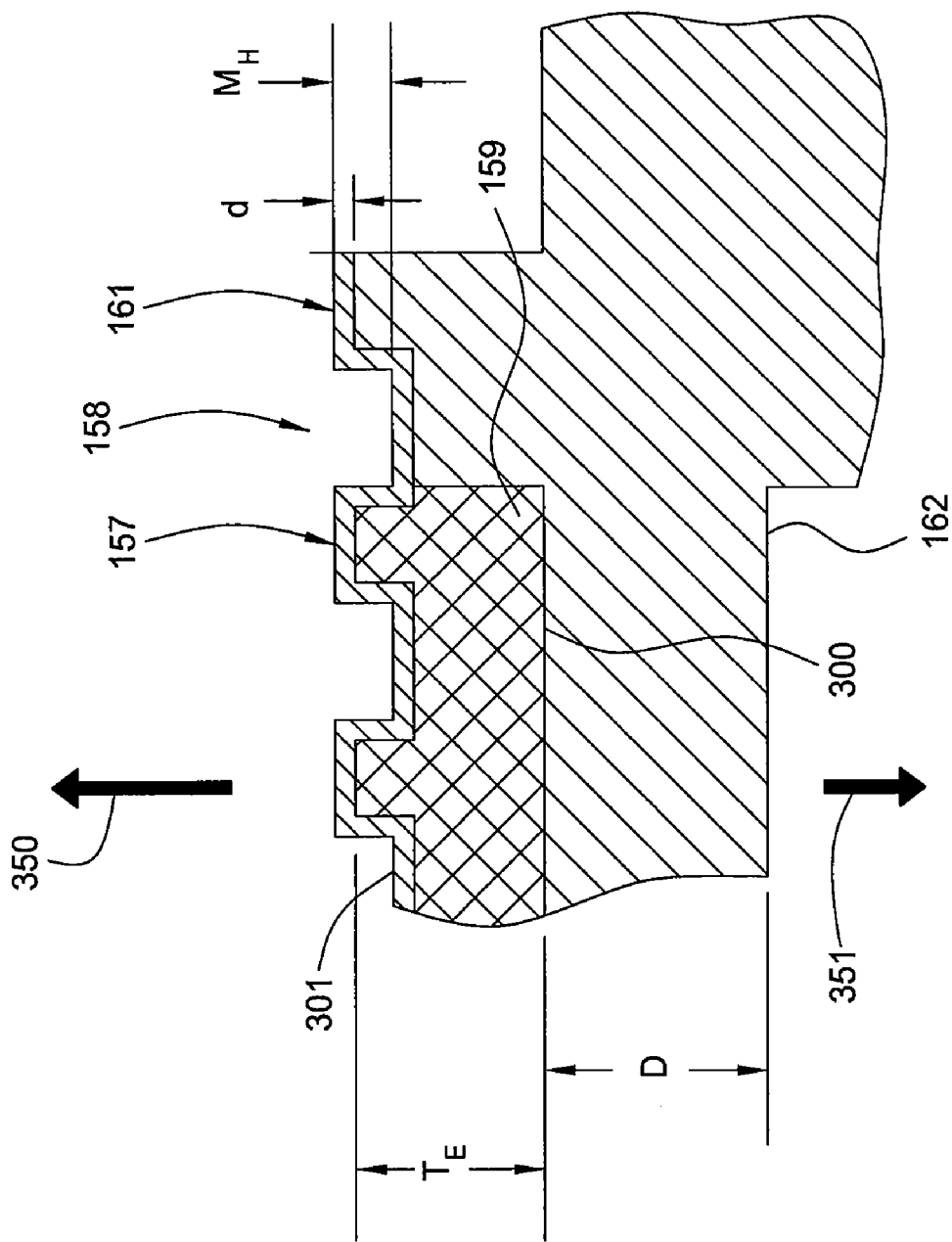

FIG. 3A is a schematic cross-sectional detail view of the electrostatic chuck assembly 124 shown in FIG. 1 according to one embodiment of the invention. Two chucking electrodes 159 are partially embedded into the electrically insulative puck base 162 on the frontside surface 206 of puck 150. For clarity, the substrate "S" is not shown. In this context, "partially embedded" means that the chucking electrodes 159 are not completely surrounded or enclosed by the material of puck base 162, and one side of each chucking electrode 159 forms part of frontside surface 206, which may be coated with a dielectric material. In another embodiment, one chucking electrode 159 may be used. In yet another embodiment, the puck 150 may include more than two chucking electrodes 159.

The puck base 162 provides a means for electrically isolating the chucking electrodes 159 from each other and the substrate "S", as well as providing a thermal conduction path and mechanical support for the chucking electrodes 159 and other components of puck 150. The puck base 162 has a thickness "D" between the chucking electrodes 159 and cooling plate 151.

The material used for the chucking electrodes 159 may be suitably chosen so that coefficient of thermal expansion (CTE) for the electrode material substantially matches the CTE of the electrically insulative puck base 162 material in order to minimize CTE mismatch and avoid thermo-mechanical stresses which may damage the puck 150 during thermal cycling. In one embodiment, an electrically conductive metal matrix composite (MMC) material is used for the chucking electrodes 159. The MMC material comprises a metal matrix and a reinforcing material which is embedded and dispersed throughout the matrix. The metal matrix may comprise a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC, and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material for the chucking electrodes 159 is preferably chosen to provide the desired electrical conductivity and to substantially match the CTE of the puck base 162 material over the operating temperature range for the electrostatic chuck assembly 124. In one embodiment, the temperature may range from about 20° Celsius to about 400° Celsius. In one embodiment, matching the CTEs comprises selecting the MCC material so that the MCC material comprises at least one material which is also used in the puck base 162 material. In one embodiment, the puck base 162 comprises aluminum oxide ($Al_2O_3$). In one embodiment, the MMC material comprises aluminum (Al) and silicon (Si). In one embodiment, the MMC composition comprises about 13 wt % Al (percent composition by weight) and about 87 wt % Si. In another embodiment, the MMC composition comprises about 50 wt % Al and about 50 wt % Si. In yet another embodiment, the MMC composition comprises about 30 wt % Al and about 70 wt % Si. In another embodiment, the MMC may comprise at least three materials, such as aluminum silicon carbide (AlSiC) or titanium silicon carbide (TiSiC), for example.

The constituent materials and composition percentages of the MMC may be selected to provide an engineered material which meets desirable design objectives. For example, by suitably selecting the MCC material to closely match the CTEs of the chucking electrodes 159 and puck base 162, the thermo-mechanical stresses within the puck base 162 are reduced which may allow the use of a less massive or thinner puck base 162 since the base thickness $T_P$ is determined in part by the structural strength required to prevent cracking or fracturing of the puck base 162 during normal temperature cycling. The reduction in thickness of the puck base 162 may provide a reduction in the cost of the puck 150. Additionally, MCC materials may be less expensive to use than other materials for some applications. For example, molybdenum may be used for chucking electrodes 159 when the puck base 162 comprises $Al_2O_3$ since molybdenum has a CTE which may provide an acceptable match to the CTE of $Al_2O_3$, but molybdenum may be significantly more expensive to use than an MCC material which provides an equivalent or closer CTE match.

Referring to FIG. 3A, the electrode bottom surface 300 of each chucking electrode 159 is bonded to the puck base 162. Diffusion bonding may be used as the method of bonding, but other bonding methods may also be used. In one embodiment, aluminum foil (not shown) approximately 50 microns (micrometers) thick is placed between the electrode bottom surface 300 and puck base 162 and pressure and heat are applied to form a diffusion bond between the aluminum foil and Al—Si MMC chucking electrode 159 and between the aluminum foil and Al₂O₃ puck base 162. In another embodiment, the chucking electrodes 159 are directly bonded to the puck base 162 using direct diffusion bonding which does not require the use of an interlayer material, such as aluminum foil.

After bonding the chucking electrodes 159 to the puck base 162, the chucking electrodes 159 and puck base 162 may be machined to form mesas 157, gas grooves 158, outer peripheral ring 161, and/or other puck 150 features at the frontside surface 206, although some of the aforementioned features may also be machined prior to electrode bonding. In one embodiment, mesas 157 and gas grooves 158 are formed in chucking electrodes 159 at frontside surface 206, as shown in FIG. 3A, and the mesa height $M_H$ ranges from about 200 microns to about 1000 microns. Each mesa 157 may also have a small protrusion or bump (not shown) to minimize the total contact area between the mesas 157 and substrate.

FIG. 3B is a schematic cross-sectional detail view of the electrostatic chuck assembly 124 shown in FIG. 3A according to one embodiment of the invention. The puck base 162 electrically isolates the chucking electrodes 159 from each other. To enable electrostatic chucking of the substrate, the chucking electrodes 159 are also electrically insulated from the substrate. In one embodiment, the chucking electrodes 159 and features formed thereon are surface treated or coated on frontside surface 206 to provide an electrically insulating, dielectric layer 301 between the chucking electrodes 159 and substrate (not shown). In another embodiment, the dielectric layer 301 comprises a dielectric material with a CTE that substantially matches the CTE of the MCC material used for the chucking electrodes 159, and the dielectric material is suitably selected to provide good adhesion to the chucking electrodes 159 and puck base 162. In one embodiment, the dielectric layer 301 comprises a material with a CTE that substantially matches the CTE of the puck base 162.

Dielectric material is deposited conformally onto the chucking electrodes 159 to form a thin, uniform dielectric layer 301 or coating over the chucking electrodes 159 and features formed thereon, such as mesas 157 and gas grooves 158, for example. The dielectric material is applied as a blanket coating which covers the chucking electrodes 159 and portions of the puck base 162 on frontside surface 206 of the puck 150. In another embodiment, the dielectric layer 301 comprises two or more layers, each layer deposited sequentially as a blanket coating.

The dielectric layer 301 may comprise one of boron nitride, aluminum oxide ($Al_2O_3$), diamond-like carbon (DLC), DLC matrix composite materials, Dylyn®, or a combination thereof, although other types of dielectric materials may be used. In another embodiment, the dielectric layer 301 provides a hardness of between about 10 GPa (giga-pascals) to about 25 GPa. In one embodiment, the dielectric layer 301 has a coefficient of static friction which ranges from about 0.15 to about 5.0. In another embodiment, the dielectric layer 301 has a coefficient of static friction which ranges from about 0.05 to about 0.2. The dielectric layer 301 may be deposited by arc-spraying, chemical vapor deposition (CVD), sputtering, or plasma-assisted CVD, but other deposition methods may also be used.

The dielectric layer 301 has a thickness "d" which may range from about 10 microns to about 1000 microns, but other thicknesses may be used. In one embodiment, the thickness "d" ranges from about 200 microns to about 800 microns. In another embodiment, the thickness "d" ranges from about 1 micron to about 10 microns. The electrode thickness $T_E$ may be suitably chosen to provide sufficient thickness for machining features such as mesas 157 and gas grooves 158 and for providing the desired mesa height $M_H$ following deposition of dielectric layer 301. In one embodiment, the electrode thickness $T_E$ is greater than about 500 microns.

In one embodiment, the chucking electrodes 159 are coupled to an RF plasma power supply 117A to drive plasma 102 (see FIG. 1). To efficiently drive the plasma 102, it is desirable to maximize the transmission of forward RF energy 350, directed towards plasma 102, and minimize the transmission of backward RF energy 351, directed away from plasma 102. The puck base 162 has thickness "D" beneath the chucking electrodes 159. The preferential transmission of RF energy towards plasma 102 may be facilitated by decreasing the capacitive impedance for RF transmission through dielectric layer 301 relative to the puck base 162. For example, by decreasing the thickness ratio "d"/"D", the forward RF energy 350 may be increased and the backward RF energy 351 decreased. A similar effect on RF transmission may be achieved for a fixed thickness ratio "d"/"D" by increasing the dielectric constant for dielectric layer 301 relative to the dielectric constant for the puck base 162 material, since the capacitive impedance may be inversely related to the dielectric constant of the transmission medium. In one embodiment, the puck base 162 has a thickness "D" which is much greater than the thickness "d" of dielectric layer 301.

One advantage in applying a dielectric layer 301 over the chucking electrodes 159 is that properties of the layer may be more easily controlled. For example, the puck base 162 may be manufactured using a sintering process which can cause variability in the dielectric constant throughout the puck base 162. The use of a deposited dielectric layer 301 to cover the chucking electrodes 159 on frontside surface 206 may provide less variability of the layer thickness and dielectric constant which, in turn, may provide greater control over the transmission of the forward RF energy 350. Additionally, the use of a separate dielectric layer 301 to cover the chucking electrodes 159 allows selection of the material and thickness for dielectric layer 301 so that the puck design may be "tuned" for efficient RF power delivery over a wide range of frequencies in a cost-effective way. In one embodiment, the electrostatic chuck assembly 124 can efficiently deliver radio frequency (RF) power over a frequency range of about 0.5 Megahertz to about 60 Megahertz with minimal RF power losses.

Figures 4A, 4B:
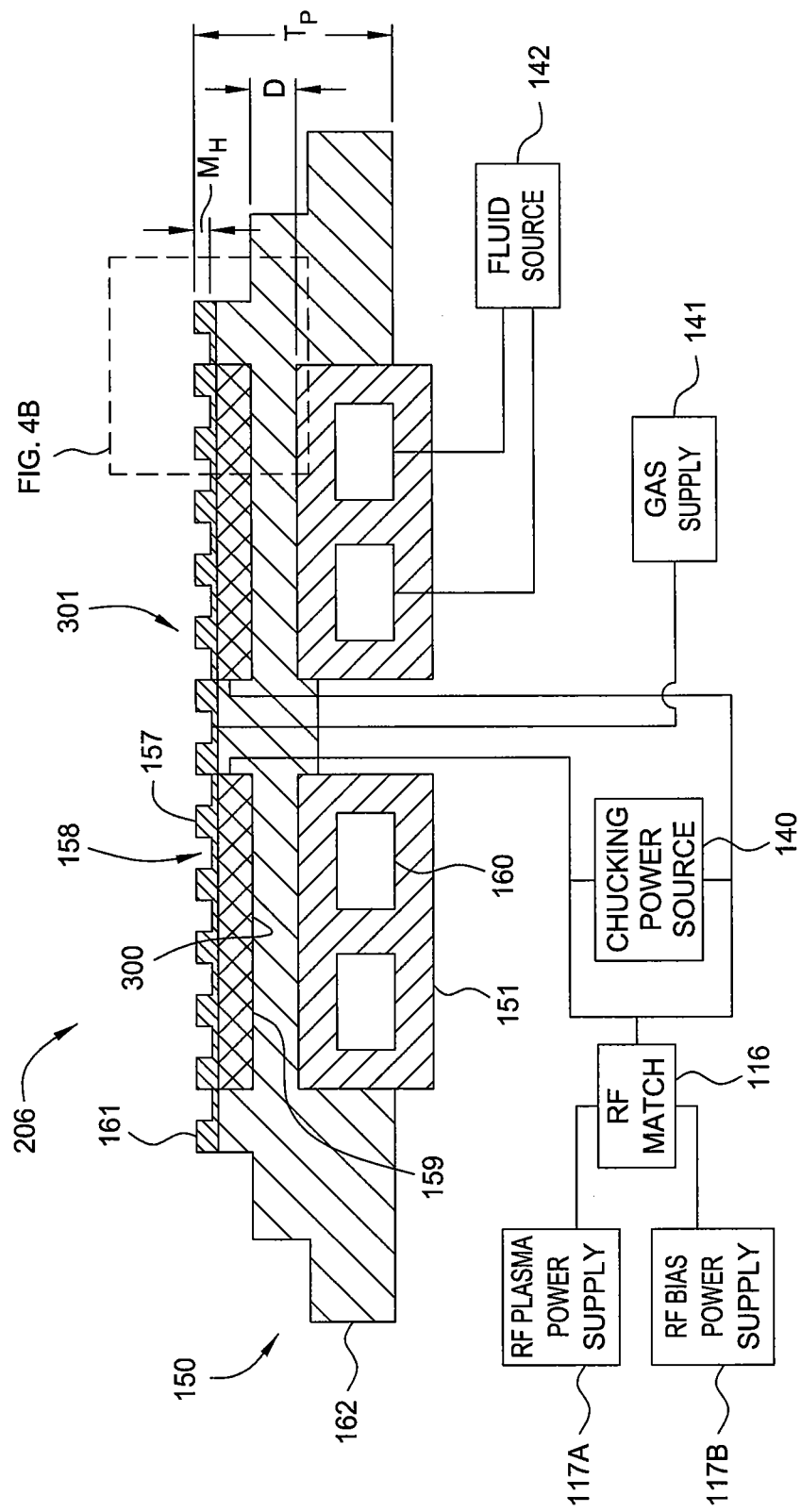
FIG. 4A is a schematic cross-sectional view of the electrostatic chuck assembly shown in FIG. 1 according to another embodiment of the invention.
FIG. 4B is a schematic cross-sectional detail view of the electrostatic chuck assembly shown in FIG. 4A according to one embodiment of the invention.
Figure 4B:
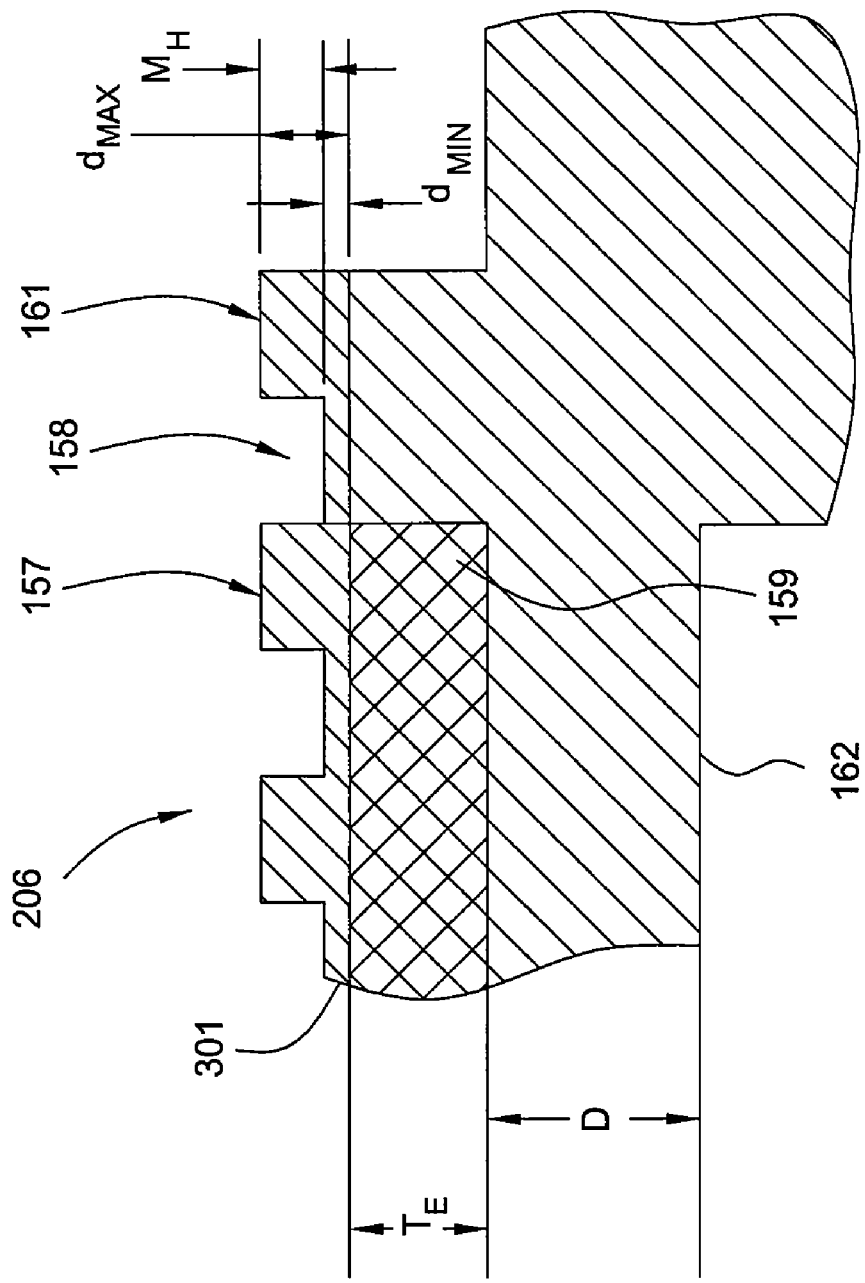

FIG. 4A is a schematic cross-sectional detail view of the electrostatic chuck assembly shown in FIG. 3A according to another embodiment of the invention. As described above, two chucking electrodes 159 are partially embedded into the puck base 162. The chucking electrodes 159 and puck base 162 form frontside surface 206 of puck 150. Dielectric material is deposited onto the chucking electrodes 159 and puck base 162 to form dielectric layer 301 on frontside surface 206. The thickness of the dielectric layer 301 is suitably chosen so that features, such as mesas 157 and gas grooves 158, for example, may be machined into the dielectric layer 301.

FIG. 4B is a schematic cross-sectional detail view of the electrostatic chuck assembly shown in FIG. 4A according to one embodiment of the invention. A maximum thickness "$d_{MAX}$" of dielectric layer 301 is chosen so that a desired minimum thickness "$d_{MIN}$" of dielectric layer 301 remains to cover chucking electrodes 159 and puck base 162 on frontside surface 206 after features have been machined into the dielectric layer 301. In one embodiment, the minimum thickness "$d_{MIN}$" ranges from about 10 microns to about 300 microns. Dielectric materials and deposition techniques which may be used for dielectric layer 301 have been described herein.

Figure 5A:
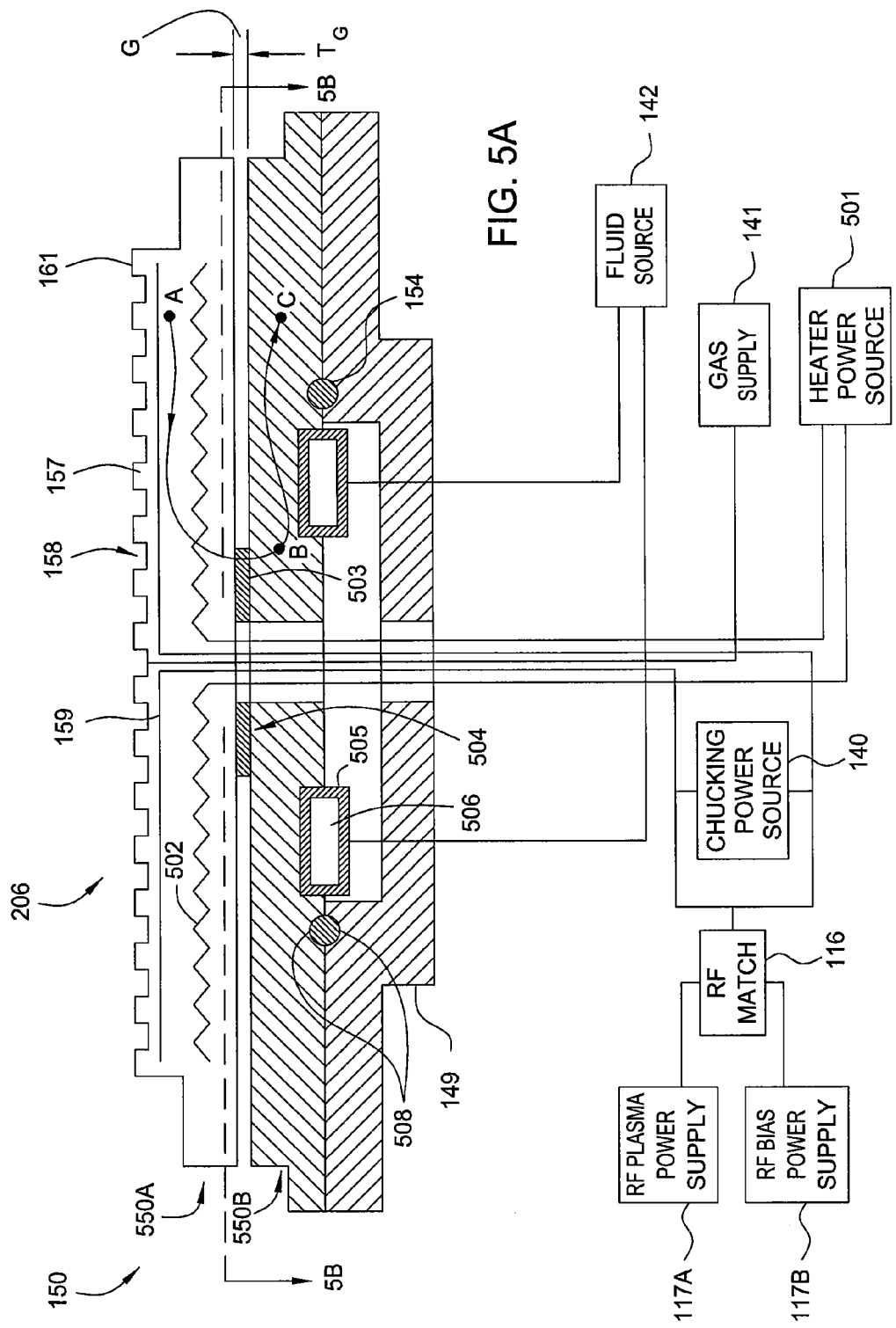
FIG. 5A is a schematic cross-sectional view of the electrostatic chuck assembly shown in FIG. 1 according to another embodiment of the invention.

FIG. 5A is a schematic cross-sectional detail view of the electrostatic chuck assembly shown in FIG. 1 according to another embodiment of the invention. The puck 150 comprises frontside surface 206, an upper puck plate 550A, and a lower puck plate 550B which are bonded together at a raised portion 503 disposed in a bonding region 504 centrally located on the puck 150. The upper puck plate 550A includes chucking electrodes 159 and one or more heating elements 502 which are electrically connected to a heater power source 501 for heating the upper puck plate 550A. The lower puck plate 550B is coupled to and in thermal communication with a cooling plate 505 having one or more cooling channels 506 in fluid communication with fluid source 142. The cooling plate 505 is disposed in proximity to one or more o-rings 154 located between the lower puck plate 550B and support housing 149 to provide a vacuum seal between the chamber interior volume 120 and an interior volume 156 within the electrostatic chuck assembly 124. The lower puck plate 550B and/or support housing 149 may include an o-ring groove 508 for o-ring 154.

The upper puck plate 550A may comprise electrically insulative materials described herein for puck base 162. In one embodiment, the upper puck plate 550A comprises one or more thermally conductive materials so that heat generated by heating elements 502 may be more efficiently delivered to the substrate. The lower puck plate 550B and upper puck plate 550A may comprise the same materials. In one embodiment, the lower puck plate 550B comprises materials which are different from the materials used for the upper puck plate 550A. In one embodiment, the lower puck plate 550B comprises a metal matrix composite material. In one aspect, the metal matrix composite material comprises aluminum and silicon. In one aspect, the upper puck plate 550A comprises aluminum nitride and the lower puck plate 550B comprises a composite material of aluminum silicon carbide. In yet another aspect, the lower puck plate 550B comprises a metal or metal alloy.

Referring to FIG. 5A, a gap "G" having a thickness "$T_G$" is formed when the upper puck plate 550A and the lower puck plate 550B are bonded together to form puck 150. In one embodiment, diffusion bonding is used as the method of bonding, but other bonding methods may also be used. In one embodiment, the upper puck plate 550A and the lower puck plate 550B comprise materials which include aluminum, and the raised portion 503 comprises an "interlayer" of aluminum foil which is placed in bonding region 504 between the upper puck plate 550A and the lower puck plate 550B, and pressure and heat are applied to form a diffusion bond between the aluminum foil and the upper puck plate 550A and between the aluminum foil and lower puck plate 550B. In another embodiment, the diffusion bond may be formed using other interlayer materials which are selected based upon the materials used for upper puck plate 550A and lower puck plate 550B. In another embodiment, the upper puck plate 550A may be directly bonded to the lower puck plate 550B using direct diffusion bonding in which no interlayer is used to form the bond.

The raised portion 503 may comprise an interlayer material, or an adhesive, or a portion of the upper puck plate 550A and/or a portion of the lower puck plate 550B, or a combination thereof. The raised portion 503 forms the gap "G" having a thickness "$T_G$". In one embodiment, the thickness "$T_G$" ranges from about 20 microns to about 1000 microns. The gap "G" minimizes the contact area between the upper puck plate 550A and the lower puck plate 550B and, thus, minimizes thermo-mechanical stresses due to any temperature differences or CTE differences that may exist between the upper puck plate 550A and the lower puck plate 550B. The upper puck plate 550A and the lower puck plate 550B are free to expand or contract independently outside of the bonding region 504 (see FIG. 5B) during thermal cycling.

Additionally, the bonding region 504 may function as a thermal choke by restricting the heat conduction path from the heated upper puck plate 550A to the unheated lower puck plate 550B. In a vacuum environment, heat transfer may be primarily a radiative process unless a conduction medium is provided. Since the puck 150 may be disposed in a vacuum environment during substrate processing, heat generated by heating elements 502 may be transferred more efficiently by conduction through bonding region 504 than by radiation across gap "G." Therefore, by adjusting the size of the bonding region 504, the heat flux flowing from the upper puck plate 550A to the lower puck plate 550B may be controlled, and the bonding region 504 functions as a thermal choke. To provide efficient heating of the substrate, it is desirable to limit the amount of heat conducted away from the upper puck plate 550A and the through the bonding region 504. On the other hand, a large temperature difference across the bonding region 504 may cause unacceptable thermo-mechanical stresses at the bonding region 504. Therefore, the area of the bonding region 504 is preferably chosen to provide efficient heating of the substrate without creating unacceptable thermo-mechanical stresses at the bonding region 504.

The thermal choke formed by the bonding region 504 may also help direct and lengthen a thermal conduction path to minimize the thermal stress on the one or more o-rings 154 used to form a vacuum seal. For example, a heat conduction path "ABC" may begin at a point "A" in upper puck plate 550A, continue through bonding region 504 to a point "B" in lower puck plate 550B, continue past cooling plate 505, and then end at a point "C" near o-ring 154. By increasing the distance of o-ring 154 from bonding region 504, the length of the thermal conduction path from any point in the upper puck plate 550A to o-ring 154 is also increased, which may cause a significant temperature drop from point "A" to point "C" due to conductive and radiative heat losses which may occur along heat conduction path "ABC." Additionally, the cooling plate 505 is placed between the bonding region 504 and o-ring 154 to help keep the o-ring 154 cool.

Figure 5B:
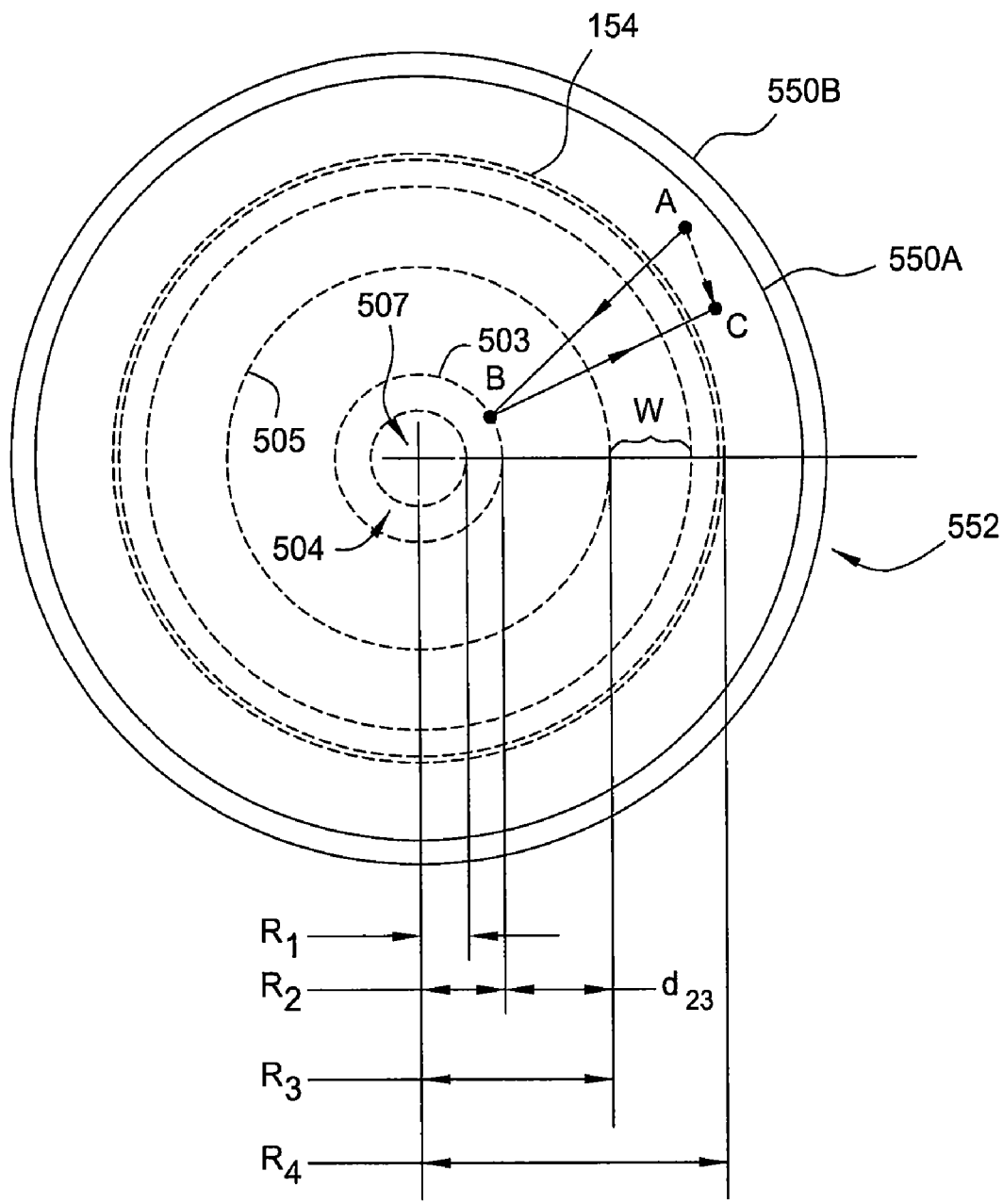
FIG. 5B is a schematic cross-sectional view of the electrostatic chuck assembly shown in FIG. 5A according to one embodiment of the invention.

FIG. 5B is a schematic cross-sectional view of the electrostatic chuck assembly shown in FIG. 5A according to one embodiment of the invention. The bonding region 504 comprises the raised portion 503 disposed in an annular region having an inner radius $R_1$ and an outer radius $R_2$. A central region 507 lies within inner radius $R_1$ and may include a gas conduit and electrical wiring (not shown). Cooling plate 505 is annular in shape and has a width "W," and is located at a radial distance $R_3$ at a distance $d_{23}=R_3-R_2$ from bonding region 504. Adjacent to cooling plate 505 is o-ring 154 located at radial distance $R_4$ and which is cooled by the cooling plate 505. Preferably, a large value is selected for radial distance $R_4$ to provide a long heat conduction path "ABC" from the upper puck plate 550A to the one or more o-rings 154 and thereby help keep the one or more o-rings 154 cool. In one embodiment, the one or more o-rings 154 are located in proximity to a lower plate periphery 552 of the lower puck plate 550B. Additionally, the radial distance $R_3$ is preferably selected so that the cooling plate 505 is in proximity to the one or more o-rings 154.

By adjusting the inner radius $R_1$ and outer radius $R_2$ of bonding region 504, and by adjusting the radial distances $R_3$ and $R_4$, the heat flux through bonding region 504 and the temperature of the o-ring 154 can be controlled for a range of operating temperatures for upper puck plate 550A. In one embodiment, the operating temperature for the upper puck plate 550A ranges from about 250 degrees Celsius (° C.) to about 450 degrees Celsius (° C.).

A thermal conduction path is shown in FIG. 5B. Heat is conducted from a point "A" in upper puck plate 550A to a point "B" near a perimeter of bonding region 504 at outer radius $R_2$, and then to lower puck plate 550B, and then to a point "C" in the lower puck plate 550B. The dashed arrow from point "A" to point "C" indicates that heat cannot conduct directly from point "A" to point "C" since gap "G" separates the two points, as shown in FIG. 5A.

Figure 6A:
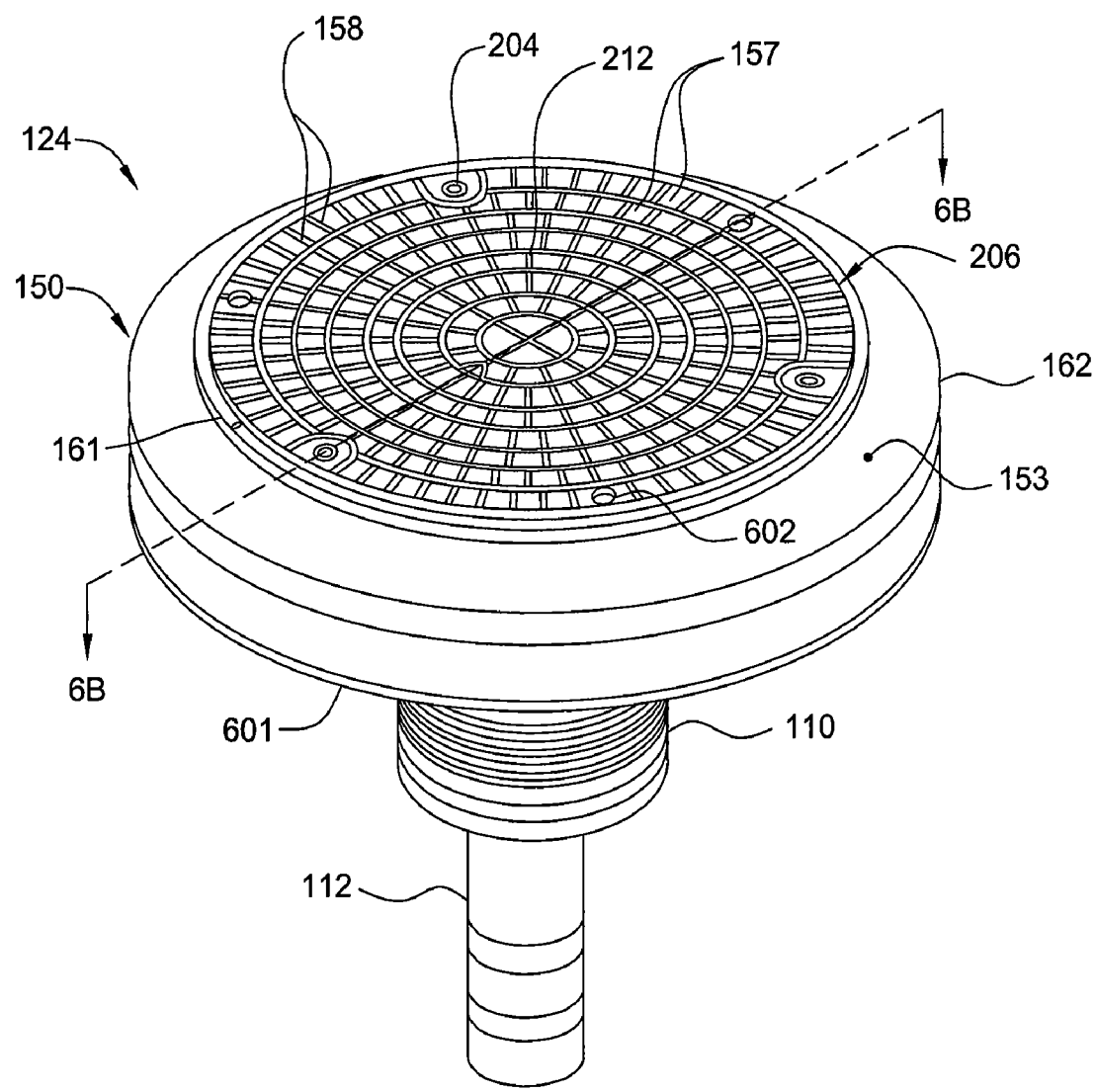
FIG. 6A is a perspective view of the electrostatic chuck assembly shown in FIG. 1 according to another embodiment of the invention.

FIG. 6A is a perspective view of the electrostatic chuck assembly 124 shown in FIG. 1 according to yet another embodiment of the invention. The electrostatic chuck assembly 124 comprises a puck 150, a cooling plate 601, and a bellows assembly 110 which includes support shaft 112. The puck 150 is coupled to the cooling plate 601, and the cooling plate 601 is coupled to the bellows assembly 110. The electrostatic chuck assembly 124 is suitably adapted so that it may be disassembled so that the puck 150 can be detached from the cooling plate 601 and the cooling plate 601 can be detached from the bellows assembly 110 (see FIG. 6E).

The puck 150 includes an electrically insulative puck base 162 and frontside surface 206 which includes gas grooves 158, mesas 157, outer peripheral ring 161, lift pin holes 204, and first flange 153 which may support an edge ring (not shown). Various embodiments for the aforementioned features and materials used for said features of puck 150 are described herein. The puck 150 also includes puck bolt holes 602 which receive bolts (see FIG. 6B) for fastening the puck 150 to the cooling plate 601. Although only three puck bolt holes 602 are shown in FIG. 6A, any number of puck bolt holes 602 may be used, and each may be disposed at any location on the puck 150. Each puck bolt hole 602 may also include a counterbore (FIG. 6D) so that the each bolt head is flush with or recessed from the surface of the puck 150.

FIG. 6B is a schematic cross-sectional view of the electrostatic chuck assembly shown in FIG. 6A according to an embodiment of the invention. The substrate "S" has been added and mesas 157 are not shown in FIG. 6B in order to clarify gas flow patterns. The substrate "S" is supported on the frontside surface 206 of puck 150 by outer peripheral ring 161 and by mesas 157. The cooling plate 601 is mounted to bellows assembly 110 by plate mounting bolts 615 which pass through holes in the cooling plate 601 and are received by threaded holes disposed in a bellows mounting flange 614. Although only two plate mounting bolts 615 are shown in the cross-section of FIG. 6B, any number of plate mounting bolts 615 may be used to fasten the cooling plate 601 to bellows mounting flange 614. The puck 150 is mounted to cooling plate 601 by puck mounting bolts 616 located in puck bolt holes 602.

The bellows assembly 110 comprises bellows mounting flange 614, support shaft 112, a bellows weldment 611, an upper bellows flange 613, and lower bellows flange 164. The support shaft 112 and upper bellows flange 613 are joined to the bellows mounting flange 614, and the bellows weldment 611 is joined to the upper bellows flange 613 and to the lower bellows flange 164. The joining methods used (e.g., welding, brazing) are suitably chosen and controlled so that a vacuum seal is formed between interior volumes 156 (which may be at atmospheric pressure) and chamber interior volume 120 (at sub-atmospheric pressure during substrate processing) when the electrostatic chuck assembly 124 is mounted to chamber 100 (see FIG. 1). The lower bellows flange 164 is mounted to the bottom of chamber 100 using a plurality of bolts (not shown), and o-ring 165 is disposed between the lower bellows flange 164 and bottom surface 126 of chamber 100 to isolate the chamber interior volume 120 from interior volumes 156 of the electrostatic chuck assembly 124. The lower bellows flange 164 is not connected to the support shaft 112, and so the support shaft 112 is free to move relative to the lower bellows flange 164.

The bellows mounting flange 614 includes a flange o-ring groove 623 for an o-ring 619 which provides a vacuum seal so that the chamber interior volume 120 is not in fluid communication with the interior volumes 156 of the electrostatic chuck assembly 124. In another embodiment, only the cooling plate 601 has an o-ring groove and the bellows mounting flange 614 does not have flange o-ring groove 623. In yet another embodiment, more than one flange o-ring groove 623 and o-ring 619 are used to provide the vacuum seal.

The cooling plate 601 comprises one or more plates 608, a plurality of cooling channels 160, two or more coolant fluid conduits 628, and a gas conduit 604. The cooling channels 160 form one or more cooling loops or circuits which are in fluid communication with a fluid source 142 which provides a coolant fluid. The cooling channels 160 may have square, rectangular, circular, or other-shaped cross-sections. The two or more coolant fluid conduits 628 are coupled to plate 608 and are in fluid communication with the cooling channels 160. The coolant fluid conduits 628 extend from cooling plate 601 and through the hollow interior of support shaft 112. The coolant fluid conduits 628 are coupled to the fluid source 142 using any suitable leak-tight coupling devices 631.

In one embodiment, the coolant fluid conduits 628 comprise the ends of a tube which is looped and shaped to form the cooling channels 160. The shaped tubing is bonded (e.g., by welding or brazing) to plate 608 to thermally couple the tubing to the plate 608. In another embodiment, the cooling channels 160 comprise channels formed (e.g., by machining) in plate 608. The plate 608 may comprise any material which is thermally conductive, such as aluminum, copper, brass, stainless steel, or other suitable materials.

The gas conduit 604 provides a means for delivering a heat transfer gas 603 from a gas supply 141 to a backside surface 606 of substrate "S." The gas conduit 604 is coupled to the cooling plate 601 so that the chamber interior volume 120 remains isolated from the interior volumes 156 of the electrostatic chuck assembly 124. In one embodiment, the gas conduit 604 comprises a tube which is welded or brazed to plate 608 to form a vacuum seal between the plate 608 and tube exterior surface. The gas conduit 604 extends from the cooling plate 601 through support shaft 112 and is coupled to gas supply 141 using any suitable gas-line coupling device 633.

The cooling plate 601 also comprises one or more central opening 639, a plurality of first bolt holes 634, second bolt holes 637, and lift pin holes 635 which extend through the cooling plate 601. The one or more central openings 639 comprise holes near the center of the cooling plate 601 so that electrical wiring and/or other elements (e.g., thermocouple) from the puck 150 can be routed through cooling plate 601 and support shaft 112 of the electrostatic chuck assembly 124. The first bolt holes 634 receive plate mounting bolts 615, and the first bolt holes 634 may include counterbores so that each plate mounting bolt 615 is flush with or recessed from the surface 636 of the plate 608. The lift pin holes 635 of cooling plate 601 are aligned with the lift pin holes 204 of puck 150 so that lift pins 109 (see FIG. 1) may move through the holes without contacting the puck 150 or cooling plate 601. The second bolt holes 637 of cooling plate 601 allow the puck 150 to be fastened to the cooling plate 601 using puck mounting bolts 616.

The cooling plate 601 includes raised portions which extend up from surface 636 of the cooling plate 601. The raised portions comprise one or more outer steps 609 and inner steps 610, and each have a top surface 638 which supports the puck 150. The one or more outer steps 609 are disposed near the periphery of the cooling plate 601, and the inner steps 610 are located inwardly relative to the one or more outer steps 609. In one embodiment, the outer step 609 comprises a raised, annular ring disposed near the periphery of the cooling plate 601, and inner steps 610 comprises raised, annular rings which surround each central opening 639, lift pin hole 635, and second bolt hole 637 (see FIG. 6E).

Each of the outer steps 609 and inner steps 610 have a step height $H_S$ which ranges from about 30 microns to about 1000 microns. In one embodiment, the step height $H_S$ ranges from about 200 microns to about 400 microns. When the puck 150 is mounted to the cooling plate 601, a gas conduction gap 632 is formed between the puck 150 and cooling plate 601. The gas conduction gap 632 has a uniform gap height which approximately equals the step height $H_S$.

The gas conduction gap 632 helps minimize thermo-mechanical stresses between the puck 150 and cooling plate 601 by limiting contact between the parts, as described in greater detail below. The gas conduction gap 632 also enables thermal coupling between the puck 150 and cooling plate 601 using the heat transfer gas 603. The thermal coupling between the puck 150 and cooling plate 601 may be adjusted by one or more means, which may include changing the pressure, flow rate, and/or type of gas used for the heat transfer gas 603. The heat transfer gas 603 is conducted from gas conduit 604 to the gas conduction gap 632 and to a plurality of gas holes 605 in the puck 150, and from gas holes 605 to gas grooves 158 which deliver the gas to the backside surface 606 of substrate "S."

Referring to FIG. 6B, the puck 150 comprises heating elements 502 and two chucking electrodes 159. In other embodiments, the puck 150 may comprise one chucking electrode 159 or more than two chucking electrodes 159. The puck 150 also includes one or more gas holes 605 which extend through the puck 150 so that heat transfer gas 603 may flow from the gas conduction gap 632 to the gas grooves 158. In one embodiment, the diameters of the gas holes 605 may be approximately equal to or less than the widths of the gas grooves 158. The gas holes 605 may also be disposed at any location and distributed in any pattern on frontside surface 206.

The heating elements 502 are electrically connected to a first pair of feedthrough conductors 625 which are electrically connected to heater power conductors 629 at electrical connections 640B. The heater power conductors 629 are then connected to the heater power source 501 at electrical connections 640A. Similarly, the chucking electrodes 159 are electrically connected to the chucking power source 140 through a second pair of feedthrough conductors 625 and chucking power conductors 630. The heater power conductors 629 and chucking power conductors 630 may comprise electrically insulated wires which are partially routed within the support shaft 112. The lengths of the feedthrough conductors 625 have been exaggerated for clarity, and the electrical connections 640B may be located within the support shaft 112. In another embodiment, one or more RF power supplies are electrically connected to the chucking electrodes 159 in addition to chucking power source 140.

The feedthrough conductors 625 comprise electrically conducting elements (e.g., metal rods and/or wires) which form part of a vacuum feedthrough 622. The vacuum feedthrough 622 also includes a feedthrough flange 621 which is mounted to the cooling plate 601 over central opening 639 using a plurality of bolts (not shown). A feedthrough o-ring 620 provides a vacuum seal between the feedthrough flange 621 and cooling plate 601. The vacuum feedthrough 622 is suitably adapted so that a vacuum seal is also formed between each of the feedthrough conductors 625 and the feedthrough flange 621, thereby allowing the feedthrough conductors 625 to pass through the feedthrough flange 621 while isolating the interior volume 156 from the volume of the central opening 639. Additionally, the vacuum feedthrough 622 keeps the feedthrough conductors 625 electrically isolated from each other and the feedthrough flange 621 (which may be made of metal) as the conductors pass through the flange.

In other embodiments, the vacuum feedthrough 622 may comprise fewer than or more than four feedthrough conductors 625, depending upon the number of chucking electrodes 159 and heating elements 502 in puck 150, for example. In yet another embodiment, the cooling plate 601 comprises more than one central opening 639, and a vacuum feedthrough 622 is mounted in each central opening 639. For example, a second central opening 639 and vacuum feedthrough 622 may be used for one or more temperature sensors (e.g., thermocouple) which are coupled to the puck 150. The vacuum feedthrough 622 may be designed for a specific application, or a commercially available feedthrough may be used to reduce component cost.

The top surfaces 638 of the inner steps 610 and outer step 609 make contact with the puck 150 but may not form a fluid seal with the puck 150 since the puck 150 is simply pressed against the top surfaces 638 by the force of the puck mounting bolts 616. Thus, the heat transfer gas 603 may "leak" between top surfaces 638 of the steps and the puck 150 and flow into the chamber interior volume 120. The heat transfer gas 603 may also flow into lift pin holes 635, second bolt holes 637, and central opening 639, for example, and then into the chamber interior volume 120. However, heat transfer gas 603 which leaks into the central opening 639 cannot flow past the feedthrough o-ring 620 of the vacuum feedthrough 622. Therefore, the pressure of the heat transfer gas 603 within the central opening 639 may increase to values which exceed the gas pressure in the chamber interior volume 120 during substrate processing. The increase in gas pressure and presence of the current-carrying feedthrough conductors 625 may result in arcing within the central opening 639. To prevent such arcing, a vent hole 627 is formed within the cooling plate 601 so that the gas within the central opening 639 may be vented to the chamber interior volume 120.

Figure 6C:
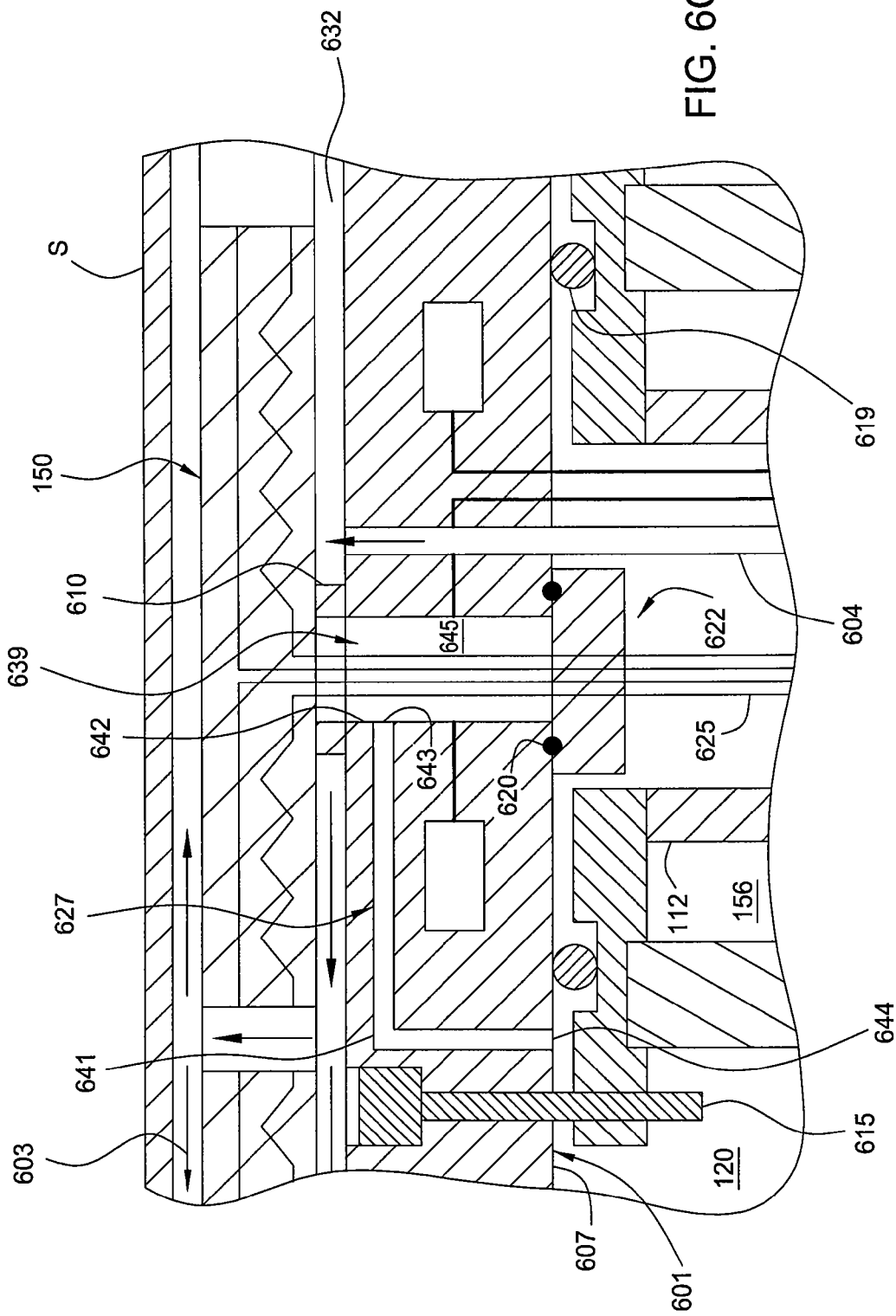
FIG. 6C is a schematic cross-sectional detail view of a vent hole shown in FIG. 6B according to an embodiment of the invention.

FIG. 6C is a detail view of a vent hole 627 shown in FIG. 6B according to an embodiment of the invention. The vent hole 627 comprises a vent hole channel 641 which connects a first hole 643 in a sidewall 642 of the central opening 639 to a second hole 644 at a bottom surface 607 of the cooling plate 601 so that a central opening volume 645 of the central opening 639 is in fluid communication with the chamber interior volume 120. The second hole 644 is disposed outside the outer diameter of o-ring 619 so that the second hole 644 is disposed on a surface of the cooling plate 601 which is in fluid communication with the chamber interior volume 120. The vent hole 627 may comprise any channel configuration which provides fluid communication between the central opening volume 645 and the chamber interior volume 120 so that the pressures of each volume may be equalized. In another embodiment, the cooling plate 601 comprises more than one central opening 639 and each central opening 639 has a vent hole 627.

The central opening volume 645 and gas conduction gap 632 may comprise at least two pressure zones within the electrostatic chuck assembly 124. A first pressure zone comprises the central opening volume 645 which has a pressure approximately equal to the pressure of chamber interior volume 120 due to the vent hole 627. A second pressure zone comprises the gas conduction gap 632 which has a pressure determined in part by the gas pressure of the heat transfer gas 603 supplied by gas conduit 604 and the flow conductance through gas holes 605 in puck 150.

Referring to FIG. 6B, the puck 150 is fastened to the cooling plate 601 using puck mounting bolts 616 which pass through second bolt holes 637 and are threaded into the cooling plate 601. As the puck 150 and cooling plate 601 go through temperature cycling during substrate processing, the puck 150 and cooling plate 601 expand and contract. The puck 150 and cooling plate 601 may be made of different materials and have different CTEs, and so the dimensional expansion and contraction for each part may also differ. To prevent excessive mechanical stresses due to CTE mismatch and which may damage the puck 150 and/or cooling plate 601, the puck 150 and cooling plate 601 are allowed to move relative to each other. As describe above, the puck 150 merely rests on the inner steps 610 and outer step 609, and so the puck 150 is "free" to move across the top surfaces 638 of the steps. The freedom of motion is constrained by the puck mounting bolts 616, and so the cooling plate 601 is suitably adapted so that the puck mounting bolts 616 are allowed to move slightly, in a direction approximately parallel to the top surfaces 638, to provide the desired movement of the puck 150 relative to top surfaces 638, and thereby prevent undesirable mechanical stresses in the puck 150. The cooling plate 601 is also suitably adapted so that the puck 150 remains aligned and securely fastened to the cooling plate 601 during temperature cycling using puck mounting bolts 616.

In one embodiment, each puck mounting bolt 616 is threaded into an insert 617 located in an insert recess 618. The insert recess 618 is suitably adapted to allow the insert 617 and puck mounting bolt 616 to move slightly, in a direction approximately parallel to top surfaces 638. The hole diameters for the second bolt holes 637 are suitably chosen to allow for slight movement of the puck mounting bolts 616 within the holes. In one embodiment, the insert recesses 618 may comprise slots which are aligned along radii of the cooling plate 601. In another embodiment, the insert 617 is a floating insert which is captured by insert recess 618.

The embodiments described above allow a relatively thin puck 150 to be used for the electrostatic chuck assembly 124. The use of a heat transfer gas 603 to thermally couple the puck 150 to the cooling plate 601 may prevent steep temperature gradients and undesirable thermal stresses within the puck 150. Additionally, the ability of the puck 150 to expand and contract independently of the cooling plate 601, in a direction approximately parallel to top surfaces 638, reduces mechanical stresses within the puck 150, and since the puck 150 is supported by the cooling plate 601, the puck 150 has minimal loading. The reduction in thermo-mechanical stresses and minimal loading allow a reduction in the material strength required for the puck 150, and so the puck 150 may be made thinner to reduce cost.

Figure 6D:
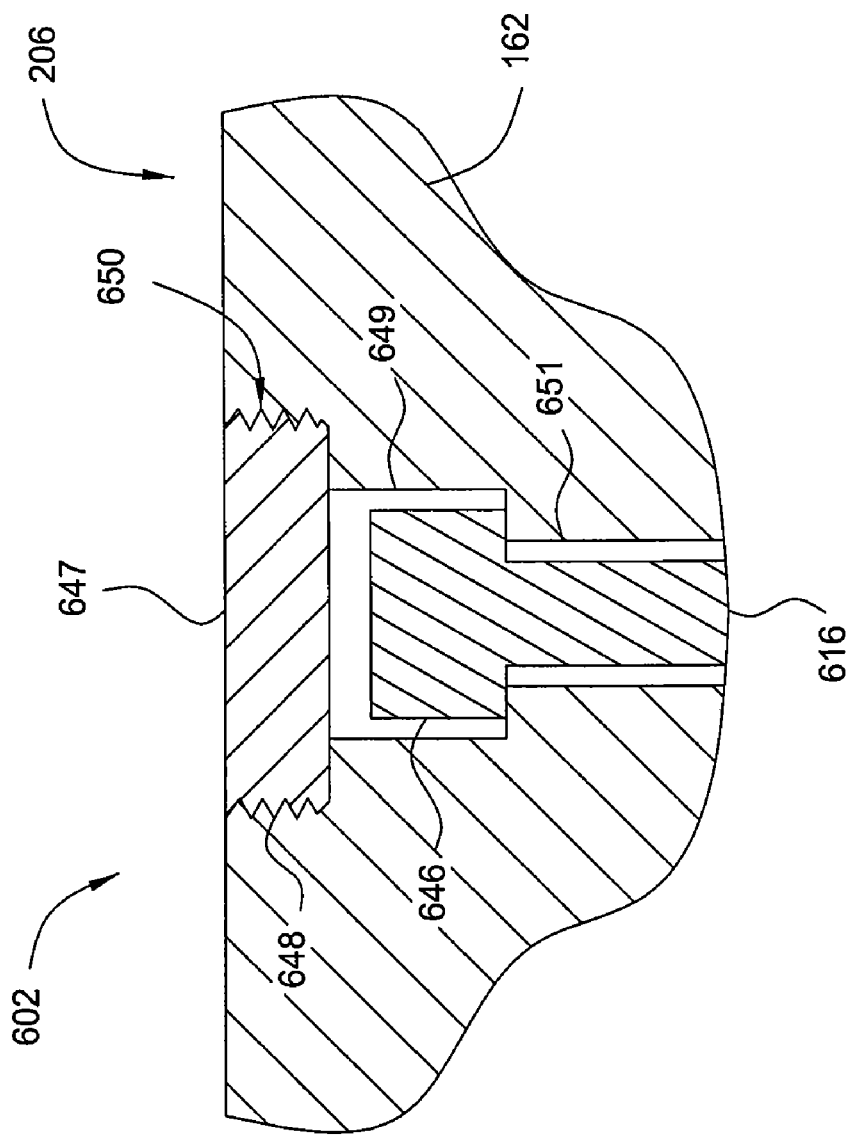
FIG. 6D is a schematic cross-sectional detail view of a bolt hole shown in FIG. 6B according to another embodiment of the invention.

FIG. 6D depicts a detail view of a bolt hole shown in FIG. 6B according to another embodiment of the invention. The puck bolt hole 602 comprises a bolt thru hole 651, a first counterbore 649, and a second counterbore 650 formed in the electrically insulative puck base 162. The puck mounting bolt 616 includes a bolt head 646 which is located within first counterbore 649, and the second counterbore 650 is threaded to receive a plug 647 which has plug threads 648. The plug 647 is made of an electrically insulative material to electrically isolate the puck mounting bolt 616 from the frontside surface 206 of the puck 150. In one embodiment, the plug 647 is made of the same material as the puck base 162. The plug 647 is suitably adapted so that it may be removed and re-installed so that the puck mounting bolt 616 may be accessed. In another embodiment, the plug 647 and second counterbore 650 are not threaded and other means are used for removing and re-installing the plug 647. The use of electrically insulative plugs 647 for puck bolt holes 602 may be desirable when applying an electrical bias to the electrostatic chuck assembly 124.

Figure 6E:
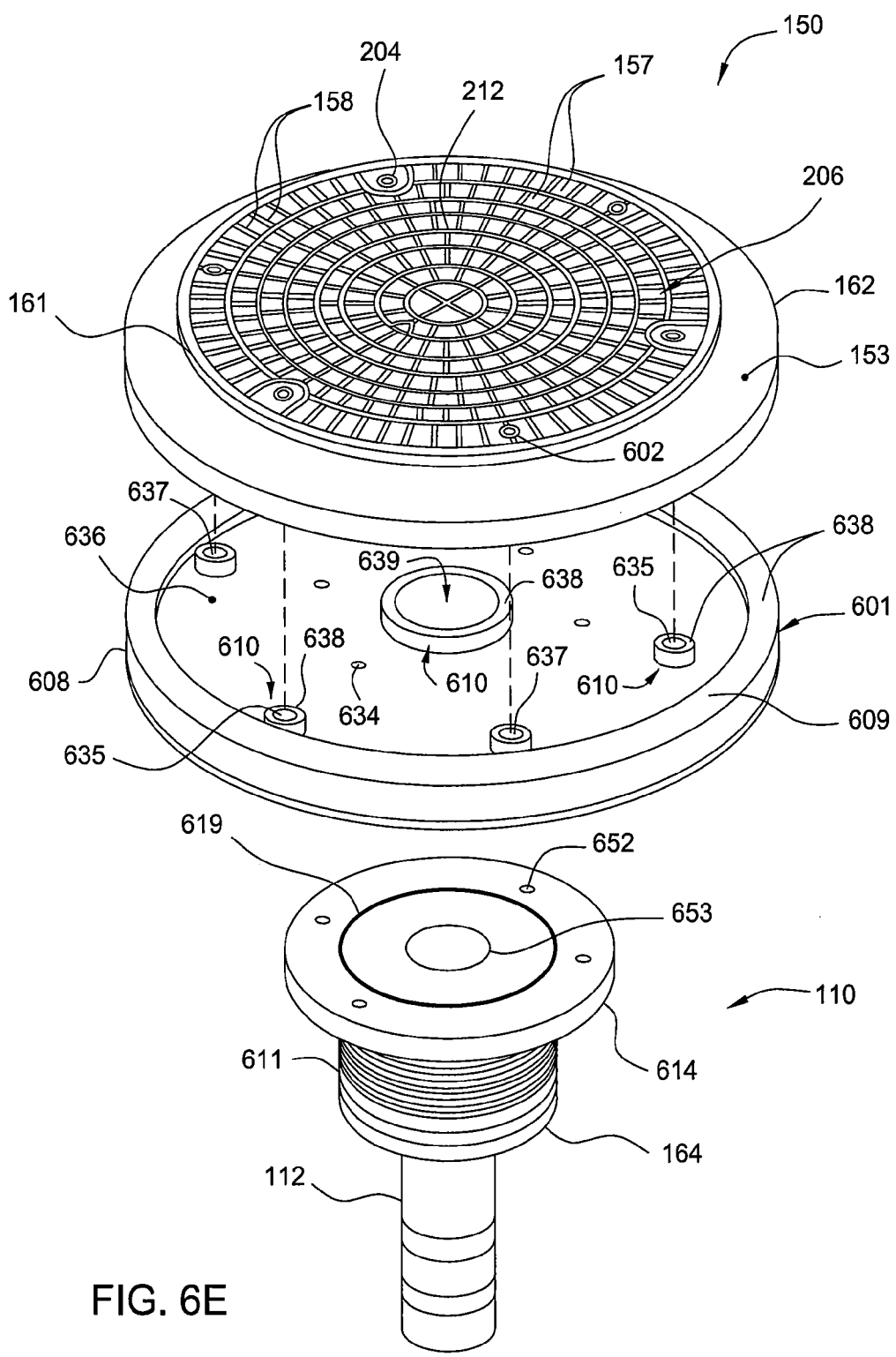
FIG. 6E depicts an exploded view of one embodiment of the electrostatic chuck assembly shown in FIG. 6A.

FIG. 6E depicts an exploded view of one embodiment of the electrostatic chuck assembly shown in FIGS. 6A and 6B. The substrate "S", electrical wiring, conduits, bolts, and vacuum feedthrough 622 have been omitted for clarity. The bellows assembly 110 includes a bellows mounting flange 614 and support shaft 112 which has a support shaft hole 653 through which are routed conduits and electrical routing (see FIG. 6B). The bellows flange 614 includes a plurality of mounting flange holes 652 which are threaded and receive plate mounting bolts 615 which are located in first bolt holes 634. Although only four mounting flange holes 652 are shown, the bellows flange 614 may have any number of mounting flange holes 652 to match the number of first bolt holes 634.

The cooling plate 601 has central opening 639 with a surrounding inner step 610 and top surface 638. Additional inner steps 610 are shown for lift pin holes 635 and second bolt holes 637. An annular outer step 609 extends around the periphery of cooling plate 601. Plate surface 636 forms one side of the gas conduction gap 632 (see FIG. 6B), and puck 150 forms the other side of the gap when puck 150 is mounted to the cooling plate 601.

While the foregoing is directed to embodiments of the present invention, other and further embodiments of the invention may be devised without departing from the basic scope thereof, and the scope thereof is determined by the claims that follow.

The invention claimed is:

1. An electrostatic chuck assembly, comprising:
 a support housing;
 a puck comprising:
  an electrically insulative upper puck plate having one or more chucking electrodes and one or more heating elements;
  a lower puck plate bonded to the upper puck plate within a bonding region comprising a raised portion; and
  a gap separating the upper puck plate from the lower puck plate outside the bonding region;
 one or more o-rings disposed between the lower puck plate and support housing; and
 a cooling plate comprising one or more cooling channels and disposed between the bonding region and the one or more o-rings, said cooling plate coupled to and in thermal communication with the lower puck plate.

2. The electrostatic chuck assembly of claim 1, wherein the one or more o-rings are located in proximity to the periphery of the lower puck plate, and the cooling plate is located in proximity to the one or more o-rings.

3. The electrostatic chuck assembly of claim 1, wherein upper puck plate comprises at least one of aluminum oxide, aluminum nitride, titanium oxide, silicon carbide, and silicon nitride.

4. The electrostatic chuck assembly of claim 1, wherein the lower puck plate comprises a metal matrix composite material.

5. The electrostatic chuck assembly of claim 1, wherein the gap thickness is between about 20 microns and about 1000 microns.

6. The electrostatic chuck assembly of claim 1, wherein the raised portion comprises an interlayer of aluminum.

7. The electrostatic chuck assembly of claim 1, wherein the bonding region comprises a thermal choke.

8. The electrostatic chuck assembly of claim 1, wherein the upper puck plate and lower puck plate are free to expand and contract independently outside of the bonding region during thermal cycling.

* * * * *